United States Patent
Brench et al.

[11] Patent Number: 5,822,195
[45] Date of Patent: Oct. 13, 1998

[54] INTERFACE THAT PERMITS DATA BUS SIGNALS TO PASS BETWEEN HIGH FREQUENCY PROCESSING UNIT AND LOW FREQUENCY EXPANSION DEVICES

[75] Inventors: Colin E. Brench, Stow; Stephen Richard Coe, Ashburnham; Samuel Hammond Duncan, Arlington; Stephen Edward Lindquist, Boylston, all of Mass.; Richard Ernest Olson, Rindge, N.H.

[73] Assignee: Digital Equipment Corporation, Maynard, Mass.

[21] Appl. No.: 834,793

[22] Filed: Mar. 31, 1997

[51] Int. Cl.⁶ ................................... H05K 07/14
[52] U.S. Cl. .................. 361/818; 361/818; 361/683; 361/687; 361/724; 361/831; 361/796; 361/797; 361/756; 361/694; 361/802; 361/799; 361/800; 361/816; 174/35 R; 174/35 GC; 174/50.59; 439/108
[58] Field of Search ..................... 361/818, 683, 361/687, 724, 831, 796, 797, 756, 694, 802, 799, 800, 816; 174/35 R, 35 GC, 50.59; 439/108

[56] References Cited

U.S. PATENT DOCUMENTS

| | | |
|---|---|---|
| 4,744,006 | 5/1988 | Duffield ................................... 361/413 |
| 5,004,867 | 4/1991 | Mast ........................................... 174/35 |
| 5,067,041 | 11/1991 | Cooke et al. ............................ 361/685 |
| 5,077,683 | 12/1991 | Aydin ........................................ 364/708 |
| 5,123,092 | 6/1992 | Buxton et al. ........................... 395/250 |
| 5,278,351 | 1/1994 | Herrick ................................. 174/35 R |
| 5,463,532 | 10/1995 | Petitpierre et al. ...................... 361/800 |
| 5,491,613 | 2/1996 | Petitpierre ............................... 361/800 |
| 5,544,008 | 8/1996 | Dimmick et al. ....................... 361/684 |
| 5,545,057 | 8/1996 | Tan et al. .............................. 439/540.1 |
| 5,579,489 | 11/1996 | Dornier et al. ......................... 395/281 |
| 5,690,306 | 11/1997 | Roesner ............................. 248/222.52 |
| 5,691,504 | 11/1997 | Sands et al. ........................... 174/35 R |
| 5,726,864 | 3/1998 | Copeland et al. ....................... 361/800 |

*Primary Examiner*—Leo P. Picard
*Assistant Examiner*—David Foster
*Attorney, Agent, or Firm*—Christopher J. Cianciolo; David J. Thibodeau, Jr.

[57] ABSTRACT

An interface module for an electronic system that permits signals to pass between a high frequency main circuit board area such as used for central processing units, memories, or other relatively high clock rate components and a low frequency circuit area such as used for standard peripheral circuit modules used for disk drives, video interfaces and the like. The interconnect module is positioned near an opening in a sheet metal bulkhead used as an electromagnetic interference (EMI) barrier around the main circuit area. The interface module uses a connector that is surrounded by one or more conductive shields that contain metal fingers on inboard and outboard sides to provide a ground connection between the interface module and the EMI barrier.

27 Claims, 5 Drawing Sheets

INTERFACE THAT PERMITS DATA BUS SIGNALS TO PASS BETWEEN HIGH FREQUENCY PROCESSING UNIT AND LOW FREQUENCY EXPANSION DEVICES

BACKGROUND

The users of personal computers, workstations, and network servers have come to expect that processing units will be compatible with certain standard bus architectures. These standards prescribe the number of data lines, protocols, interrupt signaling, and other technical specifications for data transfer. By purchasing a central processing unit that is compatible with such a standard, the user can in turn ensure proper compatibility with peripheral devices such as disk drives, displays, modems, and printers. The standard buses which have become popular include the Industry Standard Architecture (ISA), Extended ISA (EISA), Personal Computer Interconnect (PCI), and other such buses.

A problem exists, however, in that current day processing units operate at clock frequencies which are much higher than those which were contemplated at the time that such industry standard buses were developed. For example, some processing units have clock rates in excess of 500 Mega-Hertz (MHz), whereas standard buses were originally designed for use with processing units operating as slowly as 8 MHz. Indeed, at the time that many industry standard buses were designed, it was not envisioned that the buses would even be physically located near electronic components that were switching at speeds in excess of 500 MHz.

As a result, the high clock frequencies associated with the input/output signals from such processing units generate electromagnetic interference (EMI) which makes operation with such industry standard buses challenging. This is likely a result of the mechanical configuration of most computing systems that make use of industry standard buses, such as an IBM-compatible personal computer. In such systems, it is common to place the electronics associated with the central processing unit on a main system circuit board or so-called motherboard. A number of industry standard bus connectors are then arranged on the motherboard for accepting expansion circuit boards. These expansion circuit boards typically connect the central processing unit to the peripheral devices such as disk drives, displays, and printers, and other input/output devices. Standard data bus signals are then routed to the bus connectors from the central processing unit via printed circuit board traces formed on the motherboard.

Unfortunately, this physical geometry does not provide adequate shielding of any high frequency signals generated on the motherboard. One attempt to deal with this situation has been to mount high speed central processing unit components in an enclosure or cabinet formed of sheet metal or an insulating material such as plastic covered with a metallic coating. The enclosure then acts as a barrier to electromagnetic emissions. Typically, the enclosure may have one or more openings for allowing data signals to pass between the central processing unit and peripheral devices, via multi-pin subminiature connectors. These connectors are usually formed from a mating shell made of a non-conductive material having pins or sockets formed therein. The openings in the enclosure are then sized to closely match the outer dimensions of the shell to assist in preventing electromagnetic radiation from escaping from the enclosure.

However, this approach does not work well when the data signals carried by the subminiature connector are expected to switch at speeds at high clock speeds, for example 500 MHz. As is known in the art, the openings made in the enclosure should be much smaller than the wavelength of the maximum expected switching frequency of the high frequency processor, otherwise, electromagnetic radiation will escape from the enclosed high frequency processor area. As the clock frequency increases, the expected wavelengths become shorter, and thus the openings in the enclosure are made smaller and smaller, until at some point the opening cannot accommodate the conventional subminiature connectors. At frequencies of 500 MHz, the opening size for such connectors is, for example, restricted to less than one-half of an inch.

A further difficulty stems from the fact that it is increasingly common for processing units to require hundreds of input/output signals. The physical space required for providing signal paths via shielded coaxial cables or even ribbon cables to the enclosure is therefore very large. Indeed, at some point it even appears impossible for the required number of connections to fit into an industry standard 600 millimeter (mm) width enclosure.

SUMMARY OF THE INVENTION

Briefly, the invention is an interface module, providing EMI shielding that permits data bus signals to pass from an area containing high frequency circuits, such as may typically include a central processing unit in a computer, to an area containing low frequency circuits, such as may include circuits used by peripheral components operating in accordance with industry standard expansion bus specifications.

The interface module consists of an interface circuit board, a multi-pin connector, and one or more conductive shields. The interface circuit board is located adjacent an opening in an electromagnetic interference (EMI) barrier which surrounds the high frequency circuit area. The opening in the EMI barrier conforms to the shape of the multi-pin connector. The multi-pin connector, which may typically be any convenient plastic connector such as the connectors sold under the trademark Metral™ by Berg Technology, is mounted on the interface circuit board adjacent the opening.

The conductive shields are placed along the outer shell of the multi-pin connector. For example, the shields can be formed as a pair of stainless steel strips with extensions disposed on the opposing edges thereof. The extensions on one side of each shield provide electrical contact to a ground plane formed in the interface circuit board. The extensions on the opposite side of each shield provide electrical contact to a surface of the EMI barrier.

The conductive shields provide a very low impedance electrical connection between the ground plane in the interface circuit board and the ground plane formed by the EMI barrier. By providing this electrical ground reference at the location where the data bus signals pass through the opening, radio frequency (RF) noise coupling through the devices which drive the data bus signals is reduced. Indeed, by ensuring a good ground reference to the interface circuit board at this point, the devices that drive the data bus signals may act as RF filters to remove any high frequency contamination from the data bus signals.

The extensions on the conductive shields are formed in such a way as to prevent electromagnetic radiation from escaping the enclosure through the opening in the EMI barrier. In the preferred embodiment, this is accomplished by forming the extensions as a row of spring fingers, where the spacing between fingers is selected to be less than or equal to approximately one-twentieth of the wavelength of the radiation generated by the high frequency circuit area to achieve the desired shielding. The length and width of the fingers are chosen to allow for tolerances in the mechanical design of the enclosure and interface circuit board and desired spring force.

To provide adequate structural rigidity and ease of assembly, the metallic shields may be held in place by a support. The support carries one or more of the shields on an interior surface thereof, adjacent the outer shell of the connector. The support may be formed by plastic injection molding and may itself be mounted on the interface circuit board.

The shields may be composed of any number of individual parts or strips provided that the spacing between parts is electrically small at the wavelength of interest and provided that the total impedance is low.

The conductive shields thus perform two important functions, providing high isolation for unwanted noise as well as a high quality transmission path for the data bus signals.

The interface also permits several hundred data bus signals to pass between the high frequency processor area and the low frequency expansion area in as small a physical space as possible. This is because industry standard, unshielded multiple pin connectors can be used.

It is also possible using the interface to meet electromagnetic emissions requirements of government regulatory authorities, such as the Class A specification of the Federal Communications Commission (FCC) of the United States of America.

BRIEF DESCRIPTION OF THE DRAWINGS

For a more complete understanding of the advantages provided by the invention, reference should be had to the following detailed description together with the accompanying drawings, in which.

DETAILED DESCRIPTION OF PREFERRED EMBODIMENTS

Figure 1:
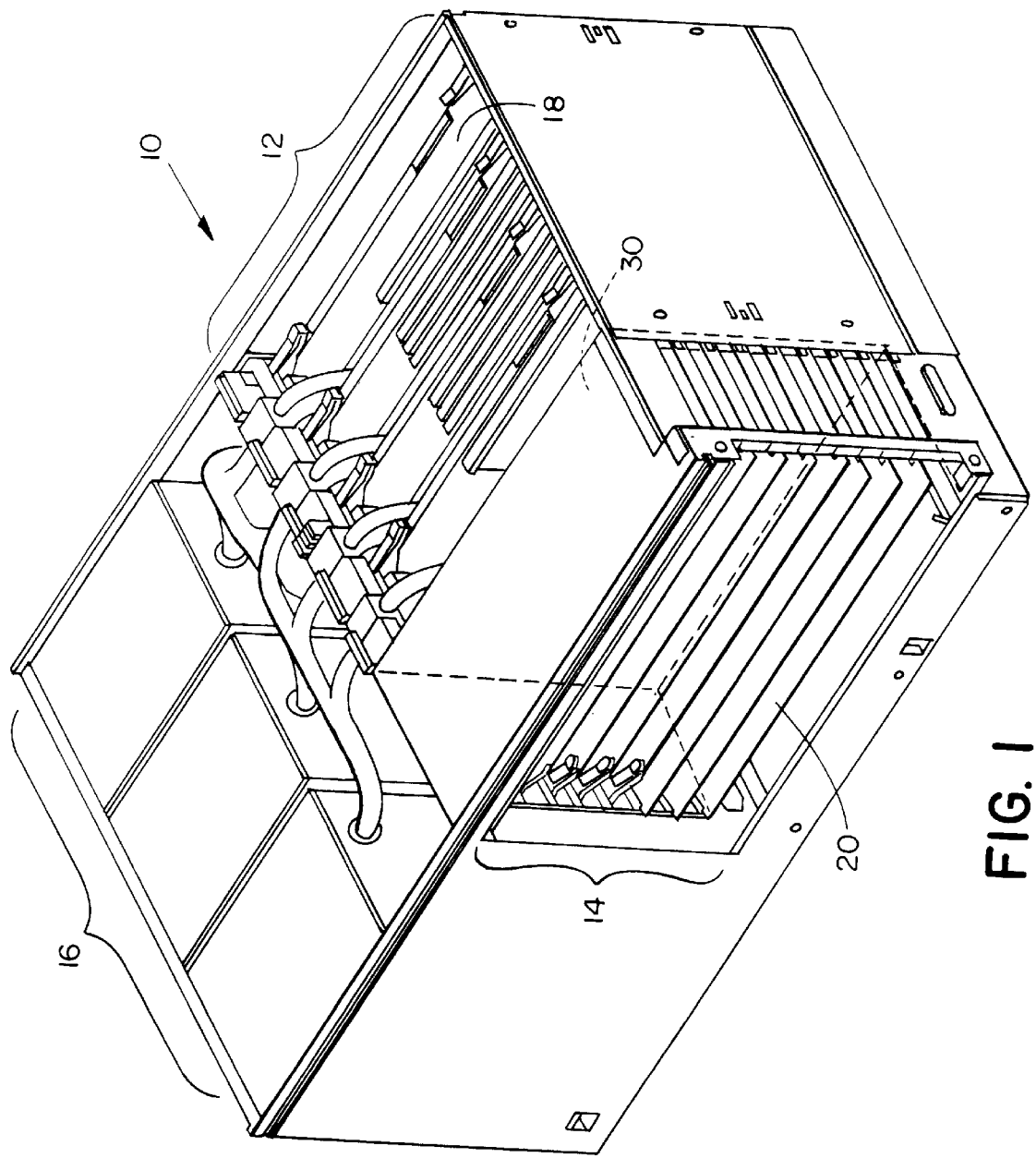
FIG. 1 is an isometric view of a computer system that makes use of an interface module according to the invention.

Turning attention now to the drawings, FIG. 1 shows an enclosure 10 for housing an electronic system such as a computer system. The enclosure 10 includes generally a main circuit board area 12, an expansion circuit board area 14, and an auxiliary area 16.

Located within the main area 12 are a number of circuit boards 18 that contain central processing unit (CPU) components, memory components, and other high speed circuitry such as may operate at clock speeds of, say, 600 MegaHertz (MHz). A conductive cover (not shown in FIG. 1) is typically disposed above the enclosure 10 to form a complete electromagnetic interface (EMI) barrier surrounding the main area 12.

The expansion circuit board area 14 has installed therein a number of expansion circuit boards 20. These expansion circuit boards 20 include peripheral functions such as disk interfaces, video display interfaces and other input/output devices. The expansion boards 20 communicate with the main circuit boards 18 in accordance with an industry standard data bus. In the embodiment discussed here, the bus used is the Personal Computer Interconnect (PCI) bus; however, it should be understood that other buses such as the Industry Standard Architecture (ISA), Extended ISA (EISA) or other buses could be used.

A vertical bulkhead 30 is disposed between the main area 12 and expansion area 14. The bulkhead 30 is typically formed of a sheet of metal such as plated sheet steel or a metallic coated board. The bulkhead 30 serves generally to shield the lower frequency expansion circuits 20 in the expansion area 14 from electromagnetic interference (EMI) generated by the higher speed circuit boards 18 contained in the main area 12.

The auxiliary area 16 contains other required components of a computer system such as power supplies or fans and the like.

Figure 2:
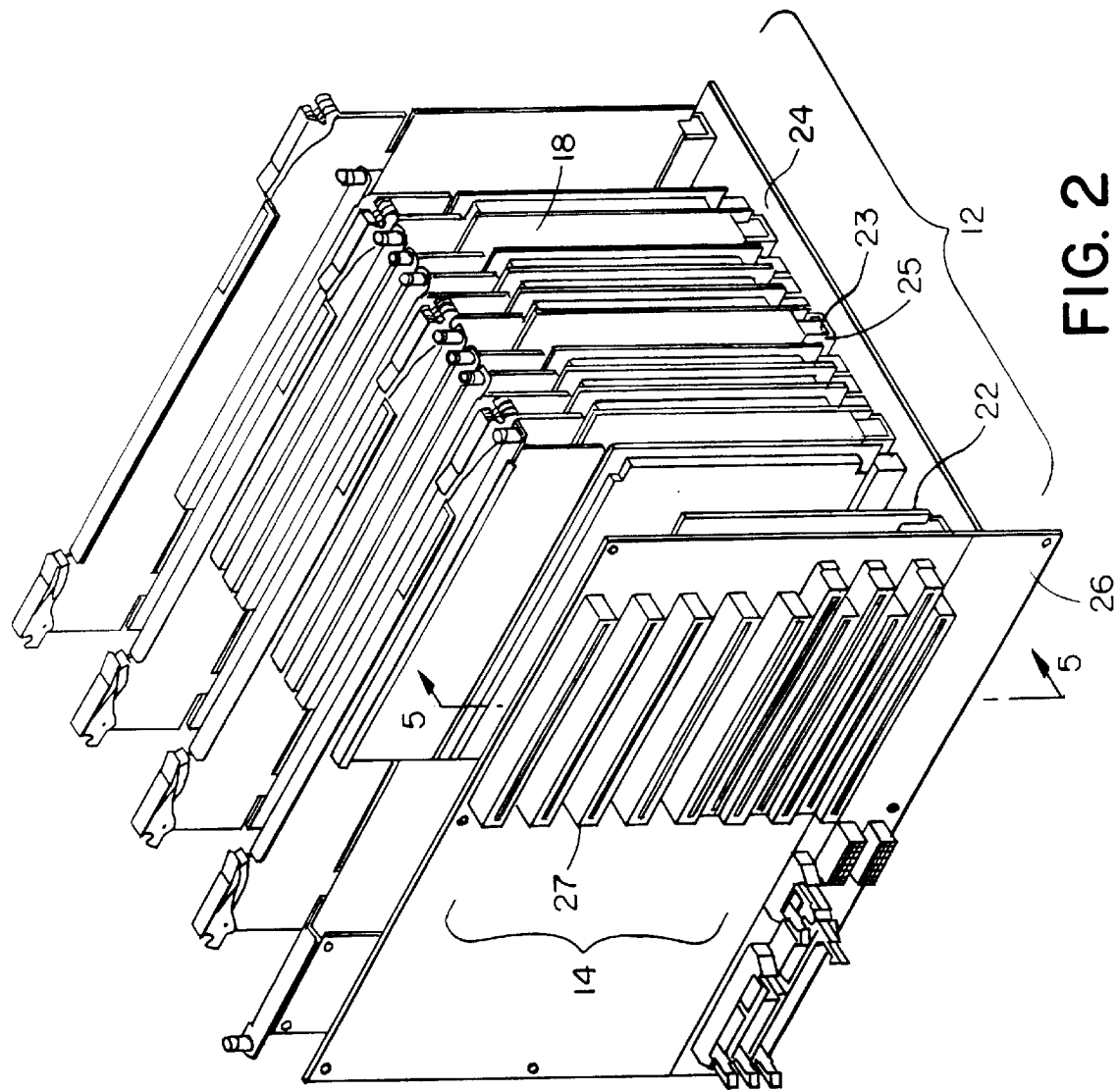
FIG. 2 is a more detailed view of the computer system showing a high speed processor area and a low speed expansion area.

FIG. 2 is a more detailed view of the main area 12 and expansion area 14 showing a partial view of an interface module 22 which, according to the invention, acts as a conduit for the industry standard bus signals passed between the main area 12 and the expansion area 14. The expansion boards 20 and bulkhead 30 are not shown in this view for clarity.

The main area 12 includes a processor motherboard 24 and the main circuit boards 18. The main circuit boards 18 contain suitable end connectors 23 that permit the main circuit boards to be inserted into a mating connector 25 mounted on the motherboard 24. In this view the motherboard 24 has a generally horizontal orientation while the main circuit boards 18 have a generally vertical orientation.

The expansion area 14 is provided with an expansion motherboard 26 having a number of expansion connectors 27 that permit the expansion boards 20 to be connected thereto. The expansion motherboard 26 is disposed perpendicularly to the main motherboard 24, and in parallel with the interface module 22. As described in detail shortly, this permits the interface module 22 to also be inserted into one of the mating connectors 25 on the main motherboard 24, specifically the mating connector closest to the expansion area 14.

Figure 3:
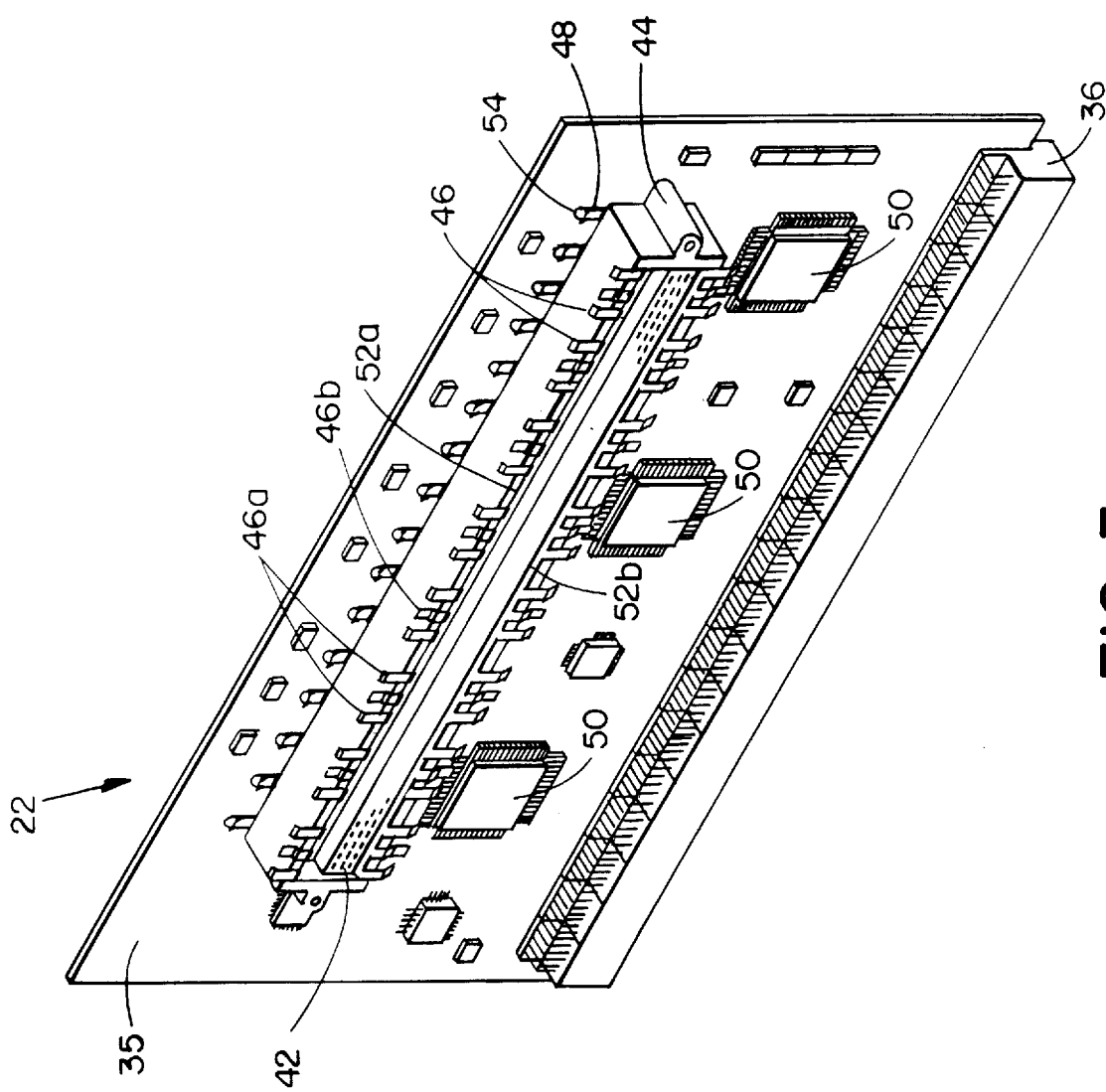
FIG. 3 is an isometric view of the interface module according to the invention.

Turning attention now to FIG. 3 it can be seen that the interface module 22 consists principally of an interface circuit board 35, a receptacle connector portion 42, and conductive shields 52a and 52b.

The receptacle connector 42 is preferably a multi-pin connector such as a 340 pin Metral™ connector. Metral™ is a trademark of Berg Technology, Inc., for its electrical connectors. The receptacle connector 42 is permanently attached to the interface circuit board 35, with the receptacle 42 intended to mate with a header connector (not shown in FIG. 3) which is connected permanently to the expansion motherboard 26 in a manner to be described later in connection with FIG. 5.

An end connector 36 is intended for mating with one of the motherboard connectors 25. The end connector 36 provides a connection for bus signals from the motherboard 24 to the interface module 22. The circuit board 35 may also contain integrated circuits (ICs) 50 such as buffer circuits to provide for proper current and/or voltage buffering of the bus signals passed between the high speed circuit area 12 and expansion circuit area 14.

The other elements of the interface module 22 ensure proper electromagnetic shielding of signals and provide for electrical ground connections between the main motherboard 24, interface circuit board 35, and the expansion motherboard 26 according to the invention.

For example, surrounding the receptacle connector portion 42 is a support 44. The support 44 is generally of the same shape as the receptacle 42 but of slightly larger dimension. The support 44 serves as a carrier for a pair of shields 52a and 52b located respectively above and below the major axes of the receptacle 42. The conductive shields 52 are preferably formed from strips of thin metal; for example, they may be 0.005 inches in thickness. The support 44 is formed from an insulating material such as plastic. It provides physical rigidity to and holds in place the shielding structure formed by the pair of conductive shields 52a and 52b.

The conductive shields 52 each contain a number of extensions in the form of spring fingers arranged as outboard fingers 46 and inboard fingers 48 on the outboard and inboard side of each shield, respectively. The fingers 46 and 48 are designed to be of a sufficient length and width to allow for tolerances in the manufacture of the various connectors, bulkhead 30, and the interface circuit board 35.

To prevent radiation from passing through an opening in the bulkhead 30 which accommodates the receptacle connector 42, the spacing between the fingers 46 and 48 is carefully selected. In general, the maximum spacing is ideally between ore-twentieth to one-fiftieth of the wavelength of the highest frequency of concern. The highest frequency of concern is typically not just the clock frequency of the components of the main circuit board 18, but rather a harmonic of that clock frequency. In the particular embodiment being described, the clock frequency is 600 MHz, and it was desired to suppress the third harmonic at 1800 MHz by 20 decibels (dB), e.g., reducing the electromagnetic energy radiated at that frequency to about one percent (1%) of the unshielded value. A spacing of approximately one-half inch or less between adjacent fingers 46 and adjacent fingers 48 accomplishes this.

The fingers 46 and 48 may be more closely spaced or even formed as a continuous strip, as long as they present an electrically continuous surface to the radiation of concern.

The inboard fingers 48 provide electrical contact between the conductive shields 52 and ground pads 54 formed on the interface circuit board 35. In a manner which will be understood shortly, the outboard fingers 46 provide electrical contact between each metal shield 52 and the bulkhead 30. The spring fingers provide a mechanically restorative force to ensure a solid connection to the ground pads 54.

The shields 52a and 52b need not form a complete enclosure around the receptacle connector 42, as long as the distance from a signal pin in the connector 42 to one of the shields 52a or 52b is less than above-mentioned one-twentieth to one-fiftieth of the highest wavelength of concern.

Furthermore, it should be understood that although the illustrated shields 52 are formed from a single strip of metal, the shields 52 and fingers 46 and 48 may alternatively be formed from a number of individual parts provided the spacing between parts is electrically small and provided that the individual parts present a low-impedance connection between the ground plane of the interface circuit board 35 and the bulkhead 30.

Figure 4:
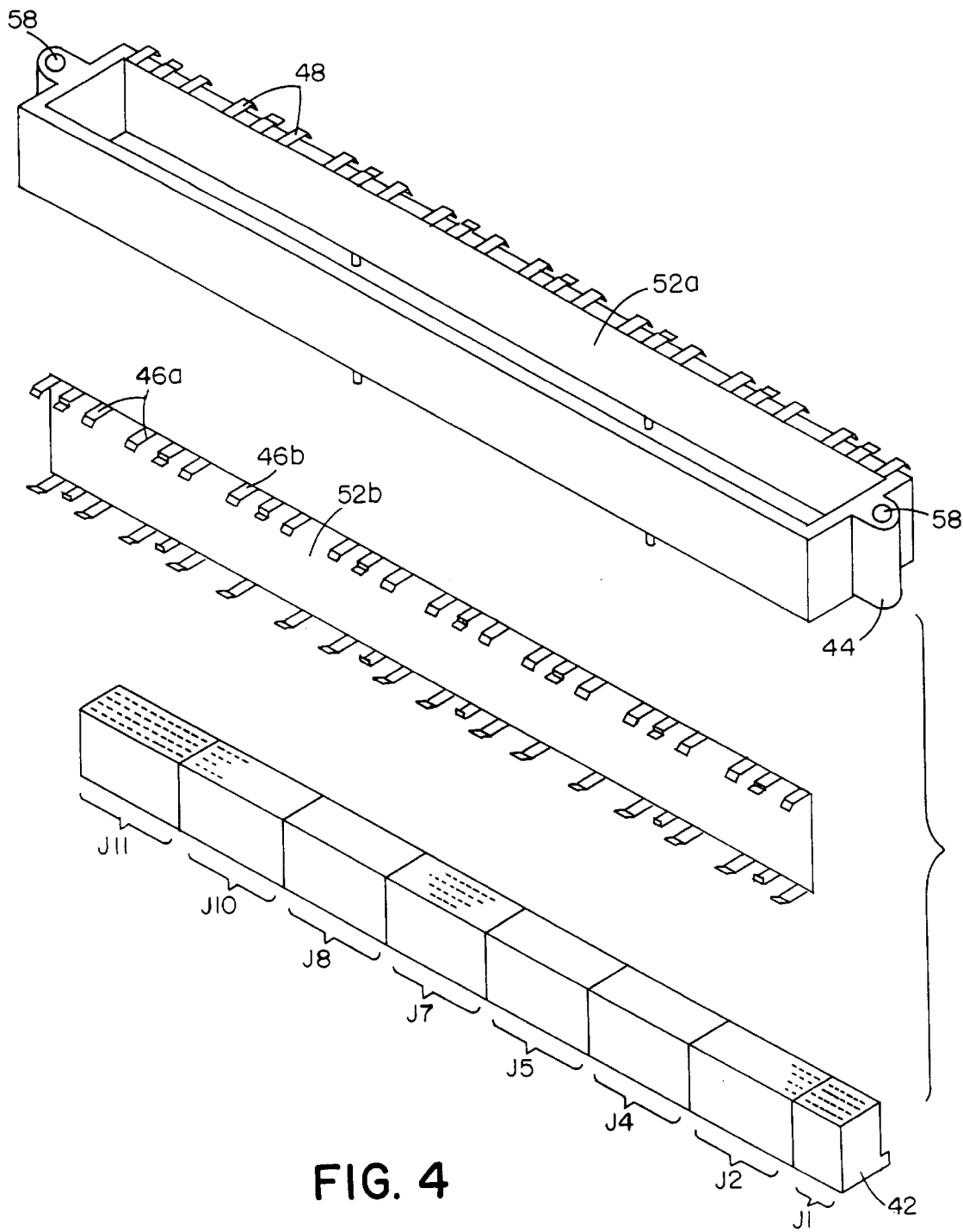
FIG. 4 is an isometric view of a support and shield subassembly.

FIG. 4 is a more detailed view showing the manner of installation of the shields 52a and 52b on the support 44. At least some of the fingers 46b and 48b are bent inward and around the inboard and outboard edges respectively of the support 44 to secure the metal shield 52 against the body of the support 44.

Holes 58 may be formed on each end of the support 44 to permit the use of fasteners such as screws to secure the support 44 to the circuit board 35.

Figure 5:
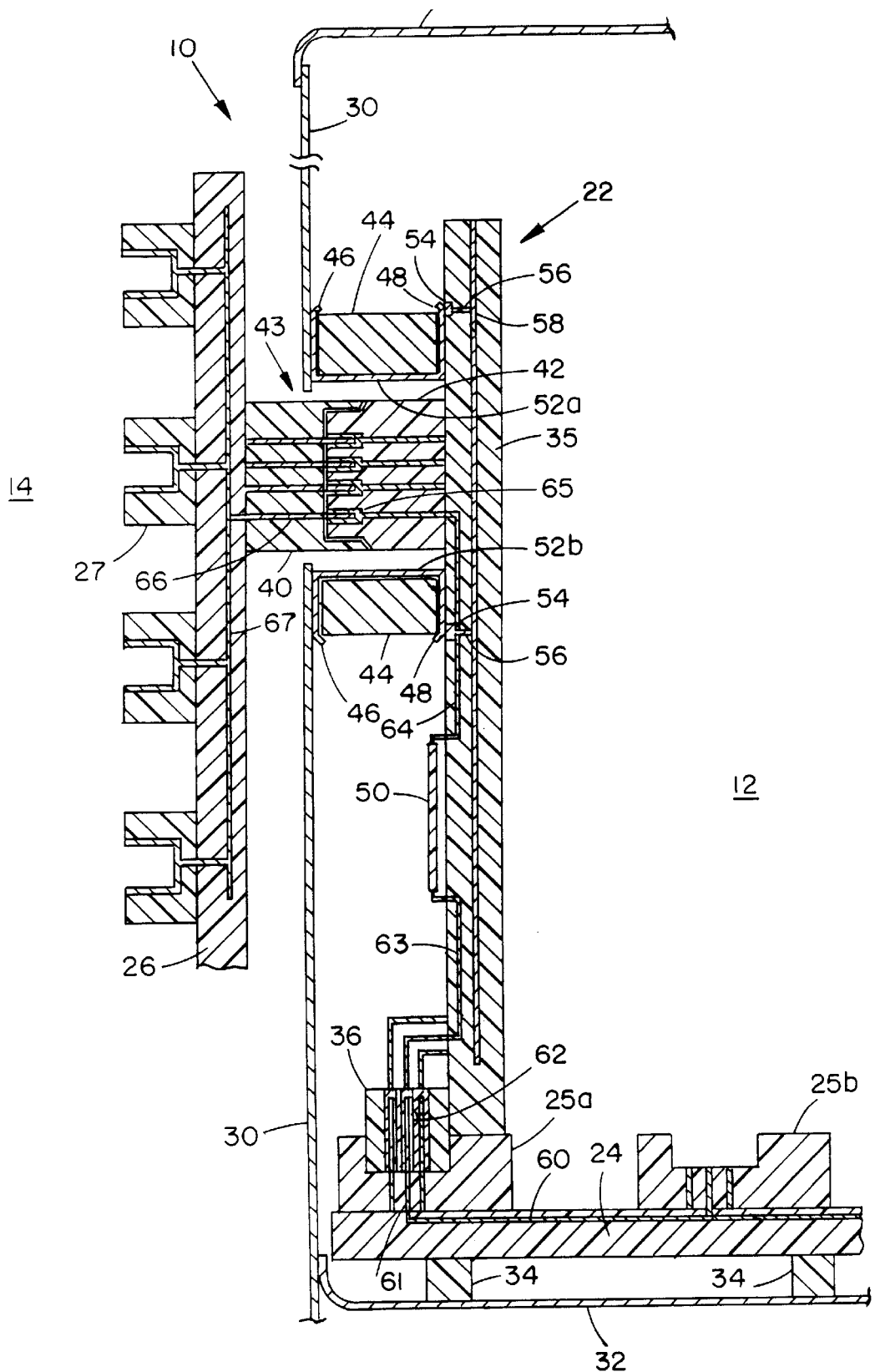
FIG. 5 is a cross-sectional view showing the interconnection of interface module in detail.

FIG. 5 is a cross-sectional view taken along lines 5—5 of FIG. 2. This view shows the manner in which the interface module 22 is installed in the system 10 to cooperate with the bulkhead 30 to prevent electromagnetic radiation generated in the main circuit board area 12 from interfering with components located in the expansion area 14, while at the same time permitting several hundred data bus signals to be passed between the main circuit board area 12 and the expansion area 14.

The bulkhead 30, together with the cover 31 and a horizontal floor 32 (all formed of metal or a metallic coated material), define an electromagnetic enclosure about the main processor area 12. Disposed within this enclosure is the main processor motherboard 24 which may be positioned above the floor 32 by spacers 34.

The end connector 36 of the interface module 22 is inserted into one of the motherboard connectors 25a disposed closest to the bulkhead 30, to position the module 22 such that the receptacle connector portion 42 is located adjacent an opening 43 formed in the bulkhead 30. The opening 43 conforms generally to the shape of the receptacle connector 42.

The receptacle connector 42 mates with a complimentary header connector 40 through the opening 43. The header connector 40 is mounted to the inside surface expansion motherboard 26, on the side opposite the expansion connectors 27.

As can be seen further in this view, the conductive shields 52a and 52b are disposed in parallel with the upper and lower surfaces of the receptacle connector 42, held in place by the support 44.

The fingers 46 and 48 act as extensions of the outboard and inboard edges, respectively, of each of the conductive shields 52. The fingers 48 disposed on the inboard side of the shields 52 contact the ground pads 54 formed on the surface of the interface circuit board 35. Vias 56 connect the ground pads 54 to a ground plane 58 formed as one the layers of the interface circuit board. The outboard fingers 46 provide electrical contact from the conductive shields 52 to the interior surface of the bulkhead 30.

The shields 52 thus provide a low impedance electrical connection between the ground plane 58 of the interface module 22 and the bulkhead 30. Furthermore, because the spacing between adjacent fingers 46 along the outboard edge and the spacing between adjacent fingers 48 along the inboard edge is electrically small, the shields provide an electrically continuous barrier to radiation originating in the main processor area 12. As a result, the shields 52 attenuate any radiation which would otherwise escape through the opening 43.

FIG. 5 also illustrates the path of a typical data bus signal traveling from the main processor motherboard 24 to the expansion motherboard 26. Although only one such data bus signal is shown, it should be understood that many such signals are similarly provided for. In particular, a printed circuit board signal trace 60 located on the main processor motherboard 24 provides a connection to a pin 61 of the motherboard connector 25a. The pin 61 mates with a plated socket 62 in the end connector 36 of the interface module 22. The end connector 36, in turn, carries the signal to a signal trace 63 formed on the interface circuit board 35. Buffer circuits 50 next process the signal and provide it to a signal trace 64. The signal then travels through a plated socket 65 in the receptacle connector 42, mating with a pin 66 in the header connector 44. Finally, the signal is routed to a trace 67 formed on the expansion motherboard 26 which connects to the expansion bus connectors 27.

The assignment of data and ground signals to particular pins of the receptacle 42 may also be made in such a way as to contribute to minimizing electromagnetic interference and proper data bus signal transmission. In the preferred arrangement, the receptacle 42 may carry enough signal pins for implementing two complete PCI buses. This arrangement of the pins is shown in Tables 1-1 and 1-2 below. Looking momentarily at the view of the connector 38 shown in FIG. 4, there are eight smaller sub-connectors labeled J1, J3, J4, J5, J7, J8, J10 and J11. The sub-connectors are arranged from right to left in descending order by J-number, as follows:

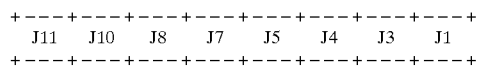

Each sub-connector consists of four rows of pins labeled A, B, C and D, with the pins in each row numbered 1 through 6 in the case of sub-connector J1, and with the pins numbered 1 through 12 in the case of the other sub-connectors. The signal names in the Tables 1-1 and 1-2 correspond to the signal names assigned by the PCI standard. There are two complete PCI buses assigned to the 340 available pins labeled PC0 and PCI1 in the table. For example, the pin located at sub-connector J1, row B, pin 6, carries the signal PCI0_GNT0$_{13}$ L, which is the GNT0_L signal for PCI bus number 0.

TABLE 1-1

Pin Assignments for Connectors J1, J3, J4, J5

| Pin | J1 | J3 | J4 | J5 |
|---|---|---|---|---|
| A1 | PCI1_REQ1_L | PCI1_AD20_H | PCI1_CBE1_L | PCI1_AD1_H |
| A2 | PCI1_REQ0_L | PCI1_AD21_H | PCI1_AD15_H | PCI1_AD0_H |
| A3 | GND | GND | GND | GND |
| A4 | PCI1_GNT2_L | PCI1_CBE3_L | PCI1_PERR_L | PCI1_AD5_H |
| A5 | PCI1_GNT1_L | PCI1_AD24_H | PCI1_LOCK_L | PCI1_AD4_H |
| A6 | GND | GND | GND | GND |
| A7 | PCI1_REQ2_L | PCI1_AD26_H | PCI1_TRDY_L | PCI1_AD8_H |
| A8 | GND | PCI1_AD28_H | PCI1_IRDY_L | PCI1_CBE0_L |
| A9 | PCI1_GNT4_L | GND | GND | GND |
| A10 | PCI1_GNT3_L | PCI1_AD31_H | PCI1_AD17_H | PCI1_AD12_H |
| A11 | GND | PCI1_REQ4_L | PCI1_AD16_H | PCI1_AD11_H |
| A12 | PCI1_GNT0_L | GND | GND | GND |
| B1 | GND | PCI1_AD19_H | PCI1_AD14_H | PCI1_ACK64_L |
| B2 | PCI0_REQ0_L | GND | GND | GND |
| B3 | PCI0_GNT4_L | PCI1_AD22_H | PCI1_PAR_H | PCI1_AD2_H |
| B4 | GND | PCI1_AD23_H | PCI1_SERR_L | PCI1_AD3_H |
| B5 | PCI0_GNT1_L | GND | GND | GND |
| B6 | PCI0_GNT0_L | PCI1_AD25_H | PCI1_STOP_L | PCI1_AD6_H |
| B7 | PCI0_REQ2_L | PCI1_AD27_H | PCI1_DEVSEL | PCI1_AD7_H |
| B8 | PCI0_REQ1_L | GND | GND | GND |
| B9 | GND | PCI1_AD29_H | PCI1_FRAM_L | PCI1_AD9_H |
| B10 | PCI0_GNT3_L | PCI1_AD30_H | PCI1_CBE2_L | PCI1_AD10_H |
| B11 | PCI0_GNT2_L | GND | GND | GND |
| B12 | GND | PCI1_REQ3_L | PCI1_AD18_H | PCI1_AD13_H |
| C1 | | GND | GND | GND |
| C2 | | PCI0_AD21_H | PCI0_AD15_H | PCI0_AD0_H |
| C3 | | PCI0_AD22_H | PCI0_PAR_H | PCI0_AD2_H |
| C4 | | GND | GND | GND |
| C5 | | PCI0_AD24_H | PCI0_LOCK_L | PCI0_AD4 H |
| C6 | | PCI0_AD25_H | PCI0_STOP_L | PCI0_AD6_H |
| C7 | | GND | GND | GND |
| C8 | | PCI0_AD28_H | PCI0_IRDY_L | PCI0_CBE0_L |
| C9 | | PCI0_AD29_H | PCI0_FRAM_L | PCI0_AD9_H |
| C10 | | GND | GND | GND |
| C11 | | PCI0_REQ4_L | PCI0_AD16_H | PCI0_AD11_H |
| C12 | | PCI0_REQ3_L | PCI0_AD18_H | PCI0_AD13_H |
| D1 | | PCI0_AD19_H | PCI0_AD14_H | PCI0_ACK64_L |
| D2 | | PCI0_AD20_H | PCI0_CBE1_L | PCI0_AD1_H |
| D3 | | GND | GND | GND |
| D4 | | PCI0_AD23_H | PCI0_SERR_L | PCI0_AD3_H |
| D5 | | PCI0_CBE3_L | PCI0_PERR_L | PCI0_AD5_H |
| D6 | | GND | GND | GND |
| D7 | | PCI0_AD27_H | PCI0_DEVSEL | PCI0_AD7_H |
| D8 | | PCI0_AD26_H | PCI0_TRDY_L | PCI0_AD8_H |
| D9 | | GND | GND | GND |
| D10 | | PCI0_AD30_H | PCI0_CBE2_L | PCI0_AD10_H |
| D11 | | PCI0_AD31_H | PCI0_AD17_H | PCI0_AD12_H |
| D12 | | GND | GND | GND |

TABLE 1-2

Pin Assignments for Connectors J7, J8, J10, J11

| Pin | J7 | J8 | J10 | J11 |
|---|---|---|---|---|
| A1 | PCI1_AD55_H | PCI1_AD38_H | PCI1_RST_L | IOD_5V_SENSE |
| A2 | PCI1_AD56_H | PCI1_AD40_H | PCI0_RST_L | VEE |
| A3 | GND | GND | GND | GND |
| A4 | PCI1_AD58_H | PCI1_AD42_H | VCC | PWRN12 |
| A5 | PCI1_AD60_H | PCI1_AD44_H | VCC | PWRN12 |
| A6 | GND | GND | GND | GND |
| A7 | PCI1_AD63_H | PCI1_AD47_H | GND | PCI1_HI_IRQ_H |
| A8 | PCI1_PAR64H | PCI1_AD48_H | PCI1_AD32_H | PCI1_LO_IRQ_H |
| A9 | GND | GND | GND | GND |
| A10 | PCI1_CBE6_L | PCI1_AD51_H | PCI1_AD34_H | RESET_POWER_OK |
| A11 | PCI1_CBE7_L | PCI1_AD52_H | PCI1_AD36_H | PWRP33 |
| A12 | GND | GND | GND | GND |
| B1 | PCI1_AD54_H | PCI1_AD39_H | GND | VEE |
| B2 | GND | GND | GND | GND |
| B3 | PCI1_AD57_H | PCI1_AD41_H | GND | PCICLK_H |
| B4 | PCI1_AD59_H | PCI1_AD43_H | GND | PWRN12 |
| B5 | GND | GND | GND | GND |
| B6 | PCI1_AD61_H | PCI1_AD45_H | GND | PCI1_CAP_LD_H |
| B7 | PCI1_AD62_H | PCI1_AD46_H | GND | PCI1_INTR_CLK_L |
| B8 | GND | GND | GND | GND |
| B9 | PCI1_CBE4_L | PCI1_AD49_H | PCI1_AD33_H | SDA |
| B10 | PCI1_CBE5_L | PCI1_AD50_H | PCI1_AD35_H | DC_ON_OCP_L |
| B11 | GND | GND | GND | GND |
| B12 | PCI1_REQ64L | PCI1_AD53_H | PCI1_AD37_H | 12C_IOINT_L |
| C1 | GND | GND | GND | GND |
| C2 | PCI0_AD56_H | PCI0_AD40_H | GND | PWRP12 |
| C3 | PCI0_AD57_H | PCI0_AD41_H | GND | IOD_5V_SENSE_RTN |
| C4 | GND | GND | GND | GND |
| C5 | PCI0_AD60_H | PCI0_AD44_H | GND | PCI0_HI_IRQ_H |
| C6 | PCI0_AD61_H | PCI0_AD45_H | GND | PCI0_INTR_CLK_L |
| C7 | GND | GND | GND | GND |
| C8 | PCI0_PAR64H | PCI0_AD48_H | PCI0_AD32_H | RSM_DC_EN_L |
| C9 | PCI0_CBE4_L | PCI0_AD49_H | PCI0_AD33_H | SCL |
| C10 | GND | GND | GND | GND |
| C11 | PCI0_CBE7_L | PCI0_AD52_H | PCI0_AD36_H | GND |
| C12 | PCI0_REQ64L | PCI0_AD53_H | PCI0_AD37_H | GND |
| D1 | PCI0_AD54_H | PCI0_AD39_H | GND | PWRP12 |
| D2 | PCI0_AD55_H | PCI0_AD38_H | GND | PWRP12 |
| D3 | GND | GND | GND | GND |
| D4 | PCI0_AD59_H | PCI0_AD43_H | GND | PCI0_CAP_LD_H |
| D5 | PCI0_AD58_H | PCI0_AD42_H | GND | PCI0_LO_IRQ_H |
| D6 | GND | GND | GND | GND |
| D7 | PCI0_AD62_H | PCI0_AD46_H | GND | RESET_REQ_L |
| D8 | PCI0_AD63_H | PCI0_AD47_H | GND | HALT_IRQ_H |
| D9 | GND | GND | GND | GND |
| D10 | PCI0_CBE5_L | PCI0_AD50_H | PCI0_AD35_H | GND |
| D11 | PCI0_CBE6_L | PCI0_AD51_H | PCI0_AD34_H | GND |
| D12 | GND | GND | GND | GND |

It can now be understood how the interface module 22 enables the interconnection of industry standard expansion boards 20 to a system 10 that also makes use of high speed central processing unit circuit boards 18, providing proper isolation of the industry standard components 20 from the electromagnetic emissions radiated by the high speed circuit boards 18.

In particular, the conductive shields 52 and the extensions thereof formed by fingers 46 and 48 provide two functions.

First, they provide a electrical ground connection between the sheet metal bulkhead 30 and the ground plane 58 on the interface module 22.

Secondly, they act as a barrier to electromagnetic interference around the receptacle connector 42 and opening 43 to prevent high frequency emissions from within the main processor area 12 from escaping out into the expansion area 14.

As a result, high frequency radiation is isolated in the main processor area 12 while at the same time the signal integrity requirements of an industry standard bus are met.

The interface module 24 allows for the use of fairly large connectors 42 to carry the bus signals, permitting interconnection of several hundred data bus signals between the two areas 12 and 14, while still providing for separation and filtering of high speed clock signal harmonics.

The invention also permits the use of inexpensive non-shielded industry standard connectors, while at the same time shielding electromagnetic emissions in an extremely compact physical space, which permits the enclosure 10 to be sized to fit standard rack systems.

While we have shown and described several embodiments in accordance with the present invention, it is to be understood that the invention is not limited thereto, but is susceptible to numerous changes and modifications as known to a person skilled in the art and we therefore do not wish to be limited to the details shown and described herein but intend to cover all such changes and modifications as are obvious to one of ordinary skill in the art.

We claim:

1. An interface module for an electronic system in which bus signals are passed from a main circuit area to an expansion area, the main circuit area being enclosed to reduce the emission of electromagnetic interference by a conductive barrier disposed between the main circuit area and the expansion area, the interface module being disposed in an area adjacent an opening formed in the conductive barrier, the interface module comprising:

a printed circuit board having an electrical ground plane, and the printed circuit board also having signal traces formed thereon for carrying the bus signals between the main circuit area and the area adjacent the opening;

a connector for carrying the bus signal from the area adjacent the opening to the expansion area, the connector disposed through the opening in the conductive barrier; and a conductive shield disposed adjacent the connector and extending from an inboard edge to an outboard edge of the connector, the shield having extensions formed on an inboard and outboard edge thereof, the extensions on the outboard edge positioned to contact the conductive barrier, and the extensions on the inboard edge positioned to contact the electrical ground plane on the printed circuit board.

2. An interface module as in claim 1 wherein the interface module is located within the conductive barrier.

3. An interface module as in claim 1 wherein the connector has a generally elongated rectangular body, and the conductive shield includes a pair of shields disposed along each of two longer sides of the connector body.

4. An interface module as in claim 1 further including a support for carrying the shield.

5. An interface module as in claim 4 wherein the shield includes fingers that are bent around the inboard and outboard edges of the support to hold the metallic shield in position against the support.

6. An interface module as in claim 1 wherein the printed circuit board includes data bus driver circuits for receiving the bus signals from electronic circuits in the main circuit area and providing them to electronic circuits in the expansion area.

7. An interface module as in claim 1 wherein the extensions include a set of metallic fingers formed as part of the shield.

8. An interface module as in claim 7 wherein the spacing between fingers is less than or equal to one-twentieth of the wavelength of clock signals generated by electronic components in the main circuit area.

9. An interface module for connecting electronic signals between components located on a main processor motherboard and an expansion motherboard, the main processor motherboard enclosed within an electromagnetic interference barrier, the interface module comprising:

a multilayer printed circuit board having a ground plane layer disposed on an inner layer thereof and electrically accessible from an outer layer by way of vias located on the printed circuit board, and also having signal trace layers for carrying data bus signals;

a first connector, mounted on the printed circuit boards for providing electrical connection for data bus signals between the main processor motherboard and the printed circuit board;

a second connector, mounted on the printed circuit board, for receiving data bus signals from the first connector via the signal traces formed on the printed circuit board, the second connector having a body formed from a non-conductive material;

a support adapted for placement around the outside of the body of the second connector, the support of the same general shape as the exterior shape of the body of the second connector; and a conductive shield having a shape conforming to the body of the support along at least one inner surface of the support adjacent the second connector, the conductive shield having fingers formed on inboard and outboard edges thereof, the fingers disposed along the outboard edge and inboard edge such that the fingers on the inboard edge contact the ground plane on the printed circuit board, and such that the fingers on the outboard edge contact the electromagnetic interference barrier.

10. An enclosure for housing the components of a computing system which includes a main processor unit that uses relatively high frequency clock signals, and the main processor unit also operating with peripheral devices that use relatively low frequency clock signals, the peripheral devices communicating with the main processing unit by using a standard data bus that is susceptible to electromagnetic interference from the high frequency clock signals that operate the main processor unit, the enclosure comprising:

a main processor motherboard, disposed within the enclosure, the motherboard having a number of main processor circuit boards inserted therein, the main processor motherboard including a bus for providing signals to the circuit boards;

an electromagnetic barrier, for enclosing the motherboard and main processor circuit boards, for preventing radiation of electromagnetic interference generated by the main processor circuit boards, the electromagnetic barrier having an opening formed therein;

an interface module, disposed within the electromagnetic barrier, the interface module including a motherboard connector for receiving bus signals from the circuit boards via the bus, the interface module disposed adjacent the opening in the electromagnetic barrier;

a header connector mounted on the interface module and disposed adjacent the opening in the electromagnetic barrier, the header connector containing a plurality of pins for receiving the bus signals;

a carrier, mounted on the interface module adjacent the header connector, the carrier of a size and shape to include an interior portion thereof that presents at least one surface that conforms to the shape of at least one exterior surface of the header connector;

a conductive shield, disposed on the at least one surface of the carrier, the conductive shield containing a conductive extension disposed on at least two edges of the conductive shield, a first edge of the conductive extension located on an outboard side adjacent the electromagnetic barrier, and a second edge of the conductive extension located on an inboard side adjacent the interface module;

an expansion circuit board, located outside of the electromagnetic barrier, the expansion circuit board having a number of expansion circuits contained therein that communicate with the main processor circuit boards via the bus signals; and a receptacle connector, mounted on the expansion motherboard, for mating with the header connector and thereby for passing the bus signals to the expansion circuit boards.

11. An enclosure as in claim 10 wherein the interface module includes bus driver circuits.

12. An enclosure as in claim 10 wherein the conductive extensions are formed as a row of conductive fingers.

13. An enclosure as in claim 10 wherein the conductive shields also include positioning fingers that are bent around the edges of the carrier surfaces to hold the conductive shields in position.

14. An enclosure as in claim 10 wherein the header connector contains a sufficient number of signal pins to carry two complete Personal Computer Interconnect (PCI) buses.

15. An enclosure as in claim 12 wherein the spacing between conductive fingers is less than or equal to one-twentieth of the wavelength of the high speed clock signals generated in the main processor unit.

16. An enclosure as in claim 14 wherein the interface module includes a circuit board having a data signal ground plane, and the conductive fingers on the inboard edge contact the data signal ground plane.

17. An enclosure as in claim 10 wherein the conductive shield is formed of a single piece of metal.

18. An enclosure as in claim 10 wherein the conductive shield contains multiple conductive extensions with the spacing between extensions sufficiently small so that the multiple conductive extensions present an electrically continuous surface.

19. A method of passing a plurality of bus signals from a first circuit area to a second circuit area, the first and second circuit areas being separated by a conductive barrier, the method comprising the steps of:

disposing a connector in an opening formed in the conductive barrier;

connecting bus signals generated in the first circuit area to the connector, the data bus signals also being referenced to an electrical ground plane in the first circuit area; and disposing a conductive shield adjacent the connector so as to extend the shield to connect on one side thereof the conductive barrier, and to connect on another side thereof the electrical ground plane.

20. A method as in claim 19 wherein the step of disposing a conductive shield further comprises disposing a conductive shield along each of two longer sides of the connector.

21. A method as in claim 19 wherein the step of disposing a conductive shield further comprises the steps of:

disposing a support around the outside perimeter of the connector; and installing the conductive shield onto the support.

22. A method as in claim 21 wherein the conductive shield includes fingers and the step of installing the shield onto the support comprises the step of bending the fingers around edges of the support.

23. A method as in claim 19 wherein the step of connecting bus signals further comprises the step of passing the bus signals through data bus driver circuits.

24. A method as in claim 19 wherein the conductive shield includes integrally formed fingers extending from an edge thereof and the step of disposing a conductive shield further comprises the step of extending the fingers to contact the conductive barrier.

25. A method as in claim 19 wherein the conductive shield includes integrally formed fingers extending from an edge thereof and the step of disposing a conductive shield further comprises the step of extending the fingers to contact the ground plane reference.

26. A method as in claim 19 wherein the conductive shield includes integrally formed fingers extending from an edge thereof.

27. A method as in claim 26 wherein the step of forming fingers additionally comprises the step of spacing the fingers such that the fingers operate as an electrically continuous surface at a frequency of interest.

* * * * *